US008030614B2

(12) United States Patent
Sato et al.

(10) Patent No.: US 8,030,614 B2
(45) Date of Patent: Oct. 4, 2011

(54) CHARGED PARTICLE BEAM APPARATUS AND DIMENSION MEASURING METHOD

(75) Inventors: Mitsugu Sato, Hitachinaka (JP); Katsuhiko Sakai, Tokyo (JP); Atsushi Takane, Mito (JP); Yoshihiko Nakayama, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 224 days.

(21) Appl. No.: 12/549,828

(22) Filed: Aug. 28, 2009

(65) Prior Publication Data

US 2009/0314938 A1    Dec. 24, 2009

Related U.S. Application Data

(63) Continuation of application No. 11/723,457, filed on Mar. 20, 2007, now Pat. No. 7,973,282, which is a continuation of application No. 11/242,129, filed on Oct. 4, 2005, now Pat. No. 7,214,936.

(30) Foreign Application Priority Data

Oct. 5, 2004   (JP) ................................. 2004-292772

(51) Int. Cl.
  *H01J 37/21*   (2006.01)
  *G01N 21/00*   (2006.01)
  *G01N 23/00*   (2006.01)
(52) U.S. Cl. ...................... 250/311; 250/310; 356/237.5; 324/751
(58) Field of Classification Search .................. 250/306, 250/307, 310, 311; 73/104, 105; 356/237.5; 324/751
  See application file for complete search history.

(56) References Cited

U.S. PATENT DOCUMENTS

| RE27,005 E | 12/1970 | Wingfield et al. |
|---|---|---|
| 4,514,634 A | 4/1985 | Lawson |
| 5,798,525 A | 8/1998 | Benizri-Carl et al. |
| 6,140,644 A | 10/2000 | Kawanami et al. |
| 6,278,114 B1 | 8/2001 | Mitsui |
| 6,310,341 B1 | 10/2001 | Todokoro et al. |
| 6,538,249 B1 | 3/2003 | Takane et al. |
| 6,825,480 B1 | 11/2004 | Watanabe et al. |

(Continued)

FOREIGN PATENT DOCUMENTS

JP    11-264726 A    9/1999

(Continued)

OTHER PUBLICATIONS

United States Office Action issued in U.S. Appl. No. 11/723,457 dated Dec. 22, 2009.

(Continued)

*Primary Examiner* — Bernard E Souw
(74) *Attorney, Agent, or Firm* — McDermott Will & Emery LLP (57) ABSTRACT

There is provided a charged particle beam apparatus which allows implementation of a high-reliability and high-accuracy dimension measurement even if height differences exist on the surface of a sample. The charged particle beam apparatus includes the following configuration components: An acquisition unit for acquiring a plurality of SEM images whose focus widths are varied in correspondence with the focal depths, a determination unit for determining, from the plurality of SEM images acquired, a SEM image for which the image sharpness degree of the partial domain including a dimension-measuring domain becomes the maximum value, and a measurement unit for measuring the dimension of the predetermined domain from the SEM image whose image sharpness degree is the maximum value.

12 Claims, 6 Drawing Sheets

U.S. PATENT DOCUMENTS

| | | |
|---|---|---|
| 6,868,175 B1 | 3/2005 | Yamamoto et al. |
| 7,030,394 B2 | 4/2006 | Watanabe et al. |
| 7,164,127 B2 | 1/2007 | Nakagaki et al. |
| 7,214,936 B2 | 5/2007 | Sato et al. |
| 7,214,938 B2 * | 5/2007 | Nakazawa et al. ............ 250/311 |
| 7,269,287 B2 | 9/2007 | Shishido et al. |
| 7,335,880 B2 | 2/2008 | Langer et al. |
| 7,460,714 B2 | 12/2008 | Shishido et al. |
| 7,608,612 B2 | 10/2009 | Matthews et al. |
| 2004/0188611 A1 | 9/2004 | Takeuchi et al. |
| 2005/0205780 A1 | 9/2005 | Nakagaki et al. |
| 2006/0060781 A1 | 3/2006 | Watanabe et al. |
| 2006/0245636 A1 | 11/2006 | Kitamura et al. |
| 2007/0187595 A1 | 8/2007 | Tanaka et al. |
| 2008/0069452 A1 | 3/2008 | Matsumoto |
| 2008/0100832 A1 | 5/2008 | Sato et al. |
| 2008/0210867 A1 | 9/2008 | Hitomi et al. |
| 2008/0245965 A1 | 10/2008 | Sugiyama et al. |
| 2009/0314938 A1 * | 12/2009 | Sato et al. ..................... 250/307 |

FOREIGN PATENT DOCUMENTS

| | | |
|---|---|---|
| JP | 2001-068048 | 3/2001 |
| JP | 2002-75263 A | 3/2002 |

OTHER PUBLICATIONS

United States Notice of Allowance issued in U.S. Appl. No. 11/723,457 dated Feb. 25, 2011.

European Search Report issued in European Patent Application No. EP 05021657.1 dated May 6, 2010.

United States Office Action issued in U.S. Appl. No. 11/723,457 dated Jul. 27, 2010.

Japanese Office Action issued in Japanese Patent Application No. 2004-292772, dated Jul. 17, 2009.

* cited by examiner

SEM IMAGE OF PATTERN

FIG.8C

SEM IMAGE OF PATTERN

FIG.8B

PATTERN CROSS-SECTION

FIG.8D

PATTERN CROSS-SECTION

CHARGED PARTICLE BEAM APPARATUS AND DIMENSION MEASURING METHOD

RELATED APPLICATIONS

This application is a continuation of U.S. application Ser. No. 11/723,457, filed Mar. 20, 2007, now U.S. Pat. No. 7,973,282 which is a continuation of U.S. application Ser. No. 11/242,129, filed Oct. 4, 2005, now U.S. Pat. No. 7,214,936, claiming priority of Japanese Application No. 2004-292772, filed Oct. 5, 2004, the entire contents of each of which are hereby incorporated by reference.

BACKGROUND OF THE INVENTION

The present invention relates to a charged particle beam apparatus using a charged particle beam such as an electron beam or ion beam. More particularly, it relates to a charged particle beam apparatus and a dimension measuring method which are preferable for measuring the dimension of a specified domain with a high accuracy even if height differences exist within the field-of-view.

In charged particle beam apparatuses representative of which is a scanning electron microscope, a narrowly converged charged particle beam is scanned on a sample, thereby acquiring desired information (e.g., sample image) from the sample. In the charged particle beam apparatuses like this, implementation of the high resolution has been progressing year by year. Of these charged particle beam apparatuses, in electron beam apparatuses in particular, diffraction phenomenon of the electrons is conspicuous and dominant. As a result, a decrease in the focal depth in accompaniment with the high-resolution implementation is unavoidable in principle. Meanwhile, under the circumstances like this, it is now required to perform a high-reliability dimension measurement with a higher accuracy. However, in a situation in particular where a plurality of measurement positions accompany height differences with respect to the electron beam, it becomes difficult to perform the high-reliability dimension measurement.

Conventionally, in order to automatically perform the dimension measurement, the following method has been generally used: Namely, a condition for allowing the best focus to be achieved is found out from the entire contrast within the field-of-view including a dimension-measuring domain. Then, after setting the focus, the dimension of a predetermined domain is measured from a SEM image newly acquired based on this focusing condition. Also, as a technique for acquiring a deep focal-depth SEM image of a sample which accompanies asperities or height differences, a technique of acquiring a plurality of SEM images with different focuses has been disclosed in JP-A-2002-75263. In JP-A-2002-75263, the method has been disclosed which allows the deep focal-depth SEM image to be acquired by extracting best-focused image domains from these SEM images respectively and superimposing these image domains into the one piece of SEM image. Also, in JP-A-11-264726, the following method has been disclosed: Namely, the plurality of SEM images with the different focuses are acquired, and the dimension measurements are performed in length-measuring domains in the respective SEM images. Then, a measurement value whose variation in the measurement results acquired for the focus variations becomes the smallest is assumed as the dimension's true value.

SUMMARY OF THE INVENTION

Each of the above-described conventional techniques has the following problems: There exists a problem that, if an automatic focus adjustment is performed in a state where height differences exceeding the focal depth of an electron-optics system exist within the field-of-view, the entire focusing condition is biased toward the focus of a densely-structured domain within the field-of-view. Accordingly, it turns out that, if the dimension-measuring domain exists outside the densely-structured domain, the length measurement is performed under a condition which deviates from the appropriate focusing condition. This situation results in a decrease in the accuracy and reliability of the length measurement value. Also, influences by magnetic hysteresis of lenses make unavoidable the inconsistency between the optimum focusing condition found out by focus search and the actual optimum focusing condition. This inconsistency causes a certain extent of error to occur in the automatic focus adjustment. Consequently, in accompaniment with the decrease in the focal depth, this focusing error becomes one cause for the reliability decrease in the length measurement value.

In the technique disclosed in JP-A-2002-75263, the highest image-sharpness-degree domains detected from the respective SEM images are combined thereby to form the one piece of SEM image. At this processing step, however, there exists a possibility that the image superimposing may fail because of influences by noise. Accordingly, in some cases, it is difficult to apply this technique to the high-reliability dimension measurement. Also, in the technique disclosed in JP-A-11-264726, no consideration has been given to the focal depth of the electron-optics system. This situation requires that, in order to perform the secure dimension measurements, the large number of SEM images be acquired by varying the focus over steps which are minute more than necessary. However, when measuring a beam-damage sensitive substance such as organic material, it is desirable to complete the measurement with the smallest possible beam irradiation amount. This is because the material which is easily subject to the electron-beam damage will shrink when exposed to the large amount of beam irradiation, and because measuring the accurate dimension becomes impossible. Consequently, in the method disclosed in JP-A-11-264726, the problem of the beam damage becomes conspicuous depending on configuration materials of the sample.

Figure 2A:
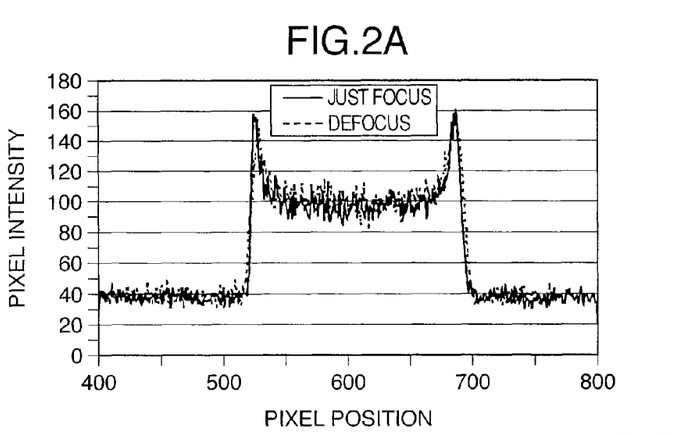
FIGS. 2A, 2B, 2C are the explanatory diagrams for explaining the SEM images resulting from acquiring the same pattern by using the beams with the different focusing conditions.
Figure 2B:
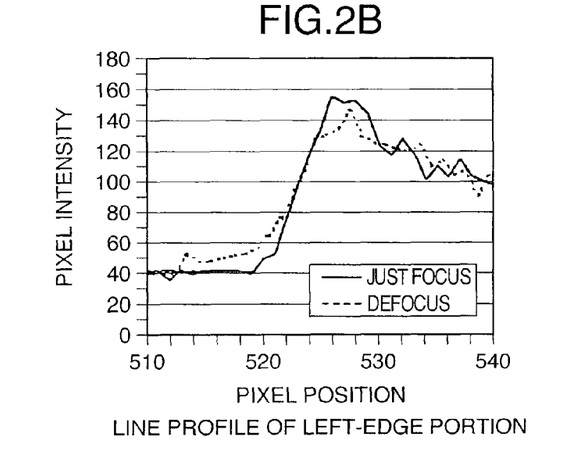
Figure 2C:
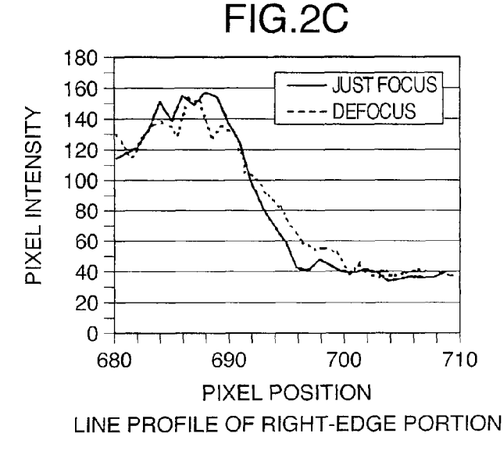

Also, the variations in the dimension measurement value depending on the focus variations vary depending on a threshold value at the time of edge detection. The reason for this will be explained referring to FIG. 2. FIG. 2 illustrates line profiles (the entire pattern, left-edge portion, and right-edge portion) of a pattern (i.e., SEM image) acquired under the appropriate focusing condition and the defocusing condition. In the example in FIG. 2, if the pixel intensity 100 is defined as the threshold value, the pattern width seldom varies depending on the focus differences. If, however, the pixel intensity 60 is defined as the threshold value, the pattern width significantly varies depending on the focus differences. In this way, the focus dependence of the dimension measurement value differs depending on the threshold value of the line profiles. Consequently, even if the dimension's true value is predicted from the dimension measurement results of the plurality of SEM images with the different focuses, the SEM images at that time are not necessarily based on the appropriate focusing condition. On account of this, a practical method has been desired which allows the high-reliability dimension measurement value to be acquired with the smallest possible beam irradiation amount required.

It is an object of the present invention to provide a charged particle beam apparatus and a dimension measuring method which allow the high-reliability dimension measurement value to be acquired under the optimum focusing condition in a dimension-measuring domain even if the height differences exist within one and the same field-of-view, or even if the focal depth is very shallow and the focusing accuracy is insufficient.

In order to accomplish the above-described object, in the present invention, a plurality of SEM images are acquired while varying the focus with a variation width which is substantially equal to value of the focal depth of the electron-optics system. Next, the image sharpness degrees of partial domains including a dimension-measuring domain of the plurality of SEM images acquired are evaluated. Moreover, a SEM image for which the image sharpness degree of the partial domain is the highest is selected, then performing the dimension measurement using this SEM image. Incidentally, if a plurality of measurement locations exist within one and the same field-of-view, corresponding partial domains are set on each measurement-location basis, then evaluating the image sharpness degrees of the images. Also, there are provided in advance an input unit for setting a range in which the beam is to be converged, and a unit for calculating the value of the focal depth of the electron-optics system. This makes it possible to acquire multi-focus SEM images in an appropriate image number.

This makes it possible to grab the images with the minimum beam irradiation amount with respect to a beam-damage sensitive sample as well. Furthermore, without resetting the focusing, the evaluation of the image sharpness degrees and the dimension measurement are performed using the plurality of SEM images themselves which are acquired under the different focusing conditions. This makes it possible to avoid the focusing error which occurs when the focusing is newly reset, thereby allowing an enhancement in the accuracy and reliability of the dimension measurement.

According to the present invention, using a high-resolution SEM with a shallow focal-depth, it becomes possible to measure the dimension of a specified domain with a high reliability and accuracy even if some extent of height differences exist within the field-of-view.

Other objects, features and advantages of the invention will become apparent from the following description of the embodiments of the invention taken in conjunction with the accompanying drawings.

DESCRIPTION OF THE EMBODIMENTS

Hereinafter, referring to the drawings, the explanation will be given below concerning embodiments of the present invention.

Figure 1:
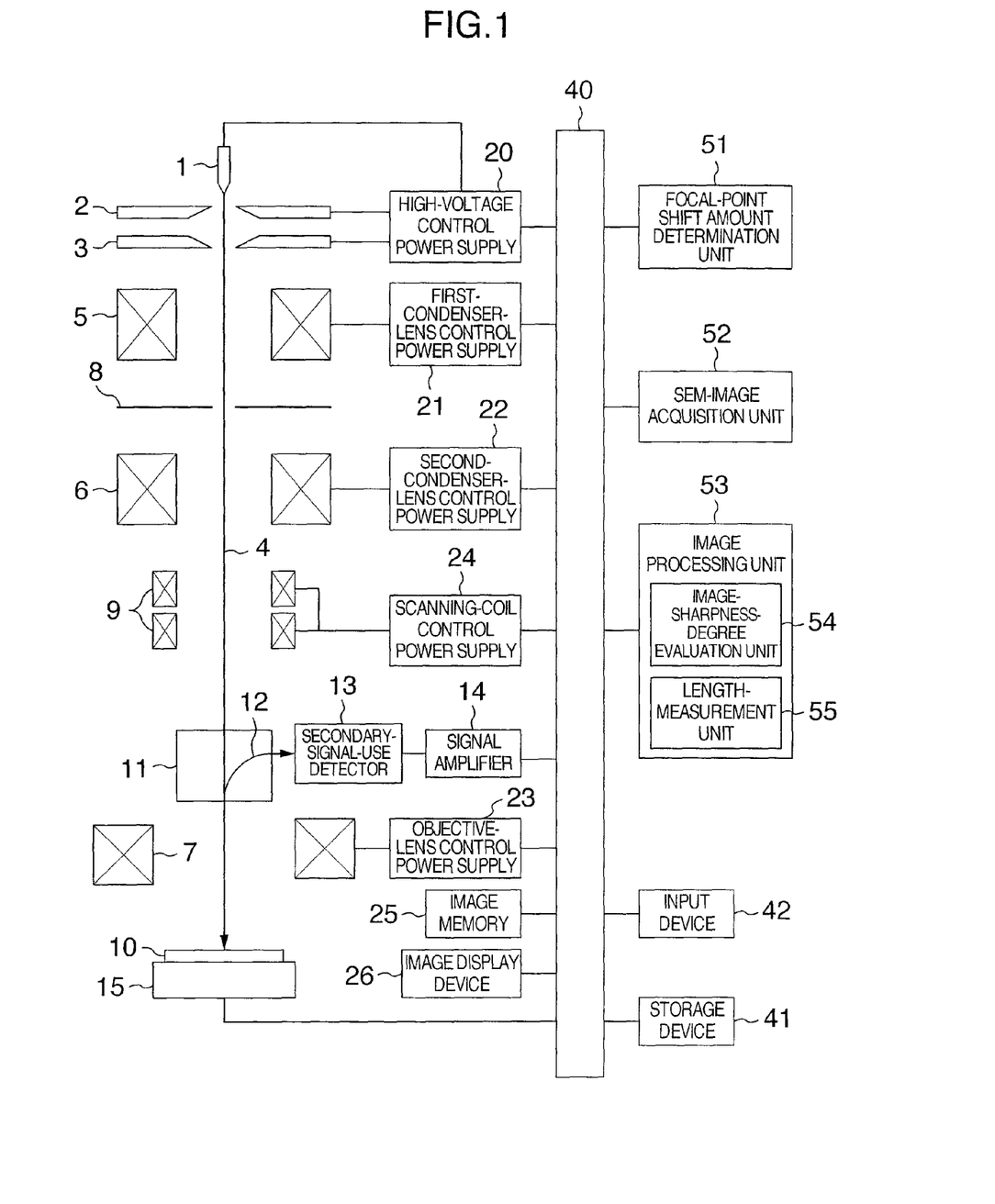
FIG. 1 is a brief configuration diagram of a scanning electron microscope which is an embodiment of the present invention.

FIG. 1 is a brief configuration diagram of a scanning electron microscope which is an embodiment of the present invention. A voltage is applied between a cathode 1 and a first anode 2 by a high-voltage control power supply 20 controlled by a computer 40. This voltage extracts a primary electron beam 4 from the cathode 1 as a predetermined emission current. An acceleration voltage is applied between the cathode 1 and a second anode 3 by the high-voltage control power supply 20 controlled by the computer 40. This acceleration voltage accelerates the primary electron beam 4 emitted from the cathode 1, thereby causing the beam 4 to travel toward a lens system at the subsequent stage. The primary electron beam 4 is converged by a condenser lens 5 controlled by a lens control power supply 21. Then, an aperture plate 8 eliminates an unnecessary region of the primary electron beam 4. After that, the primary electron beam 4 is converged onto a sample 10 as a microscopic spot by a condenser lens 6 controlled by a lens control power supply 22 and an objective lens 7 controlled by an objective-lens control power supply 23. The objective lens 7 is capable of assuming various types of modes such as the in-lens system, out-lens system, and snorkel-lens system (i.e., semi-in-lens system). Also, the retarding system is assumable which decelerates the primary electron beam by applying a negative voltage to the sample. Moreover, each of the lenses may be configured with an electrostatic lens including a plurality of electrodes.

The primary electron beam 4 is scanned on the sample 10 in a two-dimensional manner by a scanning coil 9 controlled by a scanning-coil control power supply 24. A secondary signal 12 such as secondary electrons, which are generated from the sample 10 by irradiation of the primary electron beam 4, travels to a region over the objective lens 7. After that, the secondary signal 12 is separated from the primary electrons by an orthogonal-electromagnetic-field generation device 11 for separating the secondary signal, then being detected by a secondary-signal detector 13. The secondary signal 12 detected by the secondary-signal detector 13 is amplified by a signal amplifier 14. After that, the secondary signal amplified is transferred to an image memory 25, then being displayed on an image display device 26 as a sample image.

A sample stage 15 is capable of displacing the sample 10 in at least two directions (i.e., X direction and Y direction) within the surface perpendicular to the primary electron beam 4. An input device 42 permits specification of image grabbing conditions (e.g., scanning speed and acceleration voltage), image output, and image storage into a storage device 41. Also, the input device 42 permits specification of a length-measuring domain as well.

This scanning electron microscope also includes a focal-point shift amount determination unit 51, a SEM-image continuous acquisition unit 52, and an image processing unit 53. The image processing unit 53 includes an image-sharpness-degree evaluation unit 54 and a length-measurement unit 55.

Based on image forming conditions of the scanning electron microscope, the focal-point shift amount determination unit 51 determines the focal depth by calculation or the like, thereby calculating focal-point shift amounts among a plurality of SEM images to be acquired. The SEM-image continuous acquisition unit 52 acquires and stores the series of SEM images whose focuses are shifted by the focal-point shift amounts determined by the focal-point shift amount determination unit 51. With respect to the series of SEM images acquired, the image-sharpness-degree evaluation unit 54 of the image processing unit 53 evaluates the image sharpness degrees of partial domains including a length-measuring domain specified by the input device 42, thereby determining a SEM image whose image sharpness degree is the highest. With respect to the SEM image whose image sharpness degree has been judged to be the highest, the length-measurement unit 55 performs the dimension measurement of the specified pattern by using the already-known method as were illustrated in FIGS. 2A, 2B, 2C.

Incidentally, the focal-point shift amount determination unit 51, the SEM-image continuous acquisition unit 52, and the image processing unit 53 may be provided outside the computer 40, or may be implemented by pieces of software which operate on the computer 40.

Figure 3:
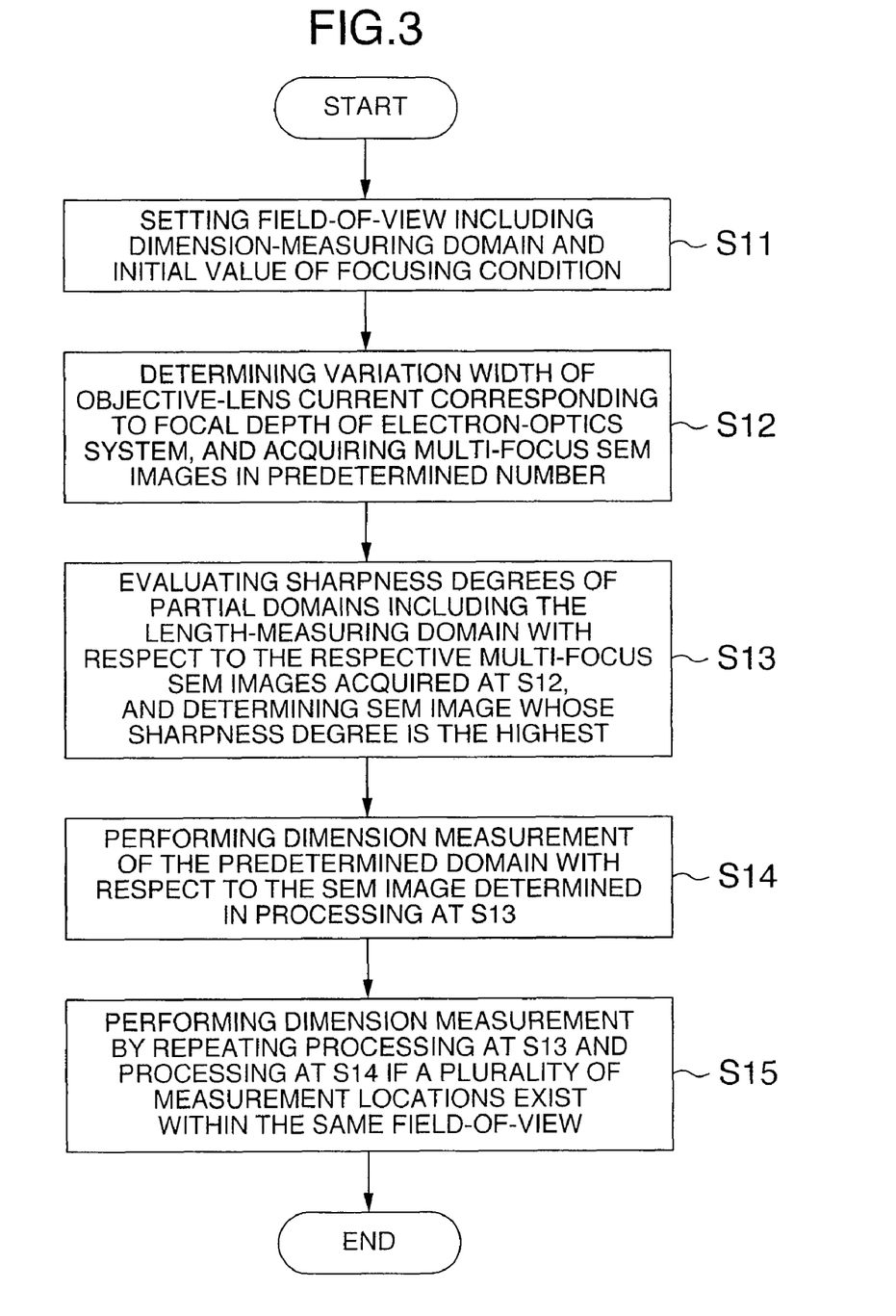
FIG. 3 is a diagram for illustrating an example of the processing flow according to the present invention.

Next, referring to FIG. 3, the explanation will be given below concerning details of the processing in the present embodiment.

(1) S11

In this processing, the field-of-view including a dimension-measuring domain and an initial value of the focusing condition are set. Positioning of the dimension-measuring domain is performed by the matching with the coordinates or template registered in advance. Also, the initial value of the focusing condition is determined as follows: Focus search is performed once with the image sharpness degree of the entire image. Then, a value acquired by defocusing its search result by a predetermined value determined in advance is defined as the initial value. The initial value of the focusing condition can also be determined as follows: The focus measurement is performed on different stage-coordinate basis, or on different field-of-view basis, thereby creating in advance a focus map which makes the stage coordinates or the field-of-views related with the focuses. Then, based on the focus map, the focus value (i.e., initial value) is determined on each stage-coordinate basis, or on each field-of-view basis.

(2) S12

In this processing, the variation width of the objective-lens current corresponding to the focal depth of the electron-optics system is determined, then acquiring multi-focus SEM images in a predetermined number. The value of the focal depth of a SEM image varies depending on various types of factors such as pixel size of the grabbed image, the acceleration voltage, and the resolution. Accordingly, the value of the focal depth can be defined from the defocus characteristic resulting from taking these factors into consideration (i.e., relationship indicating blurring amount of the image in response to the focus variation).

Figure 4:
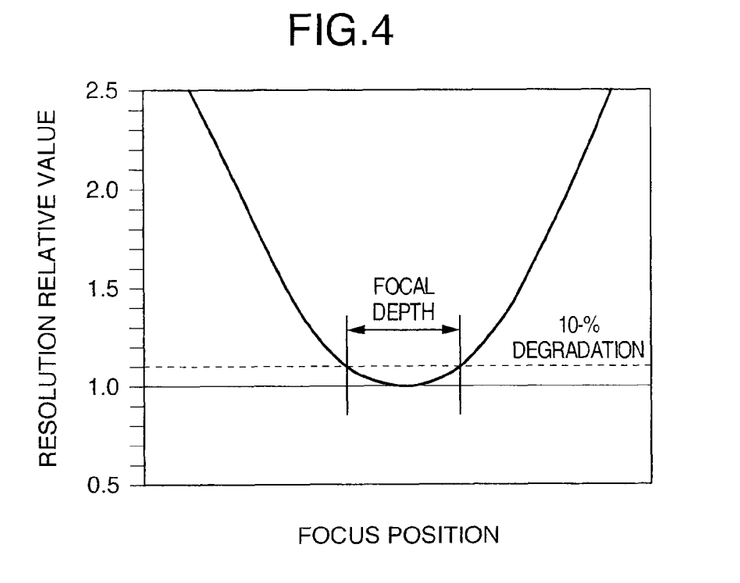
FIG. 4 is a schematic diagram of the defocus characteristic and the focal depth of the SEM image.

FIG. 4 illustrates the defocus characteristic schematically. The longitudinal axis in FIG. 4 indicates the resolution relative value of a SEM image at the time when the optimum focusing condition is selected as the criterion. From this drawing, the range in which the resolution relative value is degraded by, e.g., 10% with reference to the optimum focusing condition can be defined as the value of the focal depth. If the measurement condition is fixed, it is also possible to calculate the value of the focal depth of the SEM image in advance, and to register the corresponding focal-point variation width (i.e., the variation width of the objective-lens current) in advance.

When observation magnification is low, the focal depth fd of a piece of scanning image with the focusing condition fixed is represented by the following expression [1]:

$$fd = A1 \times (dpix/M) \times R \times \sqrt{Vacc} \qquad [1]$$

Here, A1 denotes a constant, dpix denotes the pixel size, M denotes the observation magnification, R denotes beam resolution (resolution determined by the beam diameter), and Vacc denotes the acceleration voltage.

If the observation magnification becomes higher, image resolution of the scanning image turns out to be limited by the beam resolution R. As a result, the focal depth fd at this time is represented by the following expression [2]:

$$fd = A2 \times R^2 \times \sqrt{Vacc} / \sqrt{(1 + 0.73 \times (Ip/B0) \times 10^{14})} \qquad [2]$$

Here, A2 denotes a constant, Ip denotes a probe current, and B0 denotes luminance of the electron gun converted into per-V basis. In the case of an electric-field emission electron source where the luminance B0 is exceedingly high, the term (Ip/B0) within the expression [2] becomes exceedingly small. As a result, the focal depth fd in the high-magnification domain can be represented as the following expression [3] from the practical standpoint:

$$fd = A2 \times R^2 \times \sqrt{Vacc} \qquad [3]$$

Incidentally, in the expression [1] to the expression [3], the beam resolution R can be represented by the following expression [4]: Accordingly, the beam resolution R in the expressions [1] to [3] can be represented in a manner of being replaced by the second term or third term of the expression [4]. Incidentally, $\lambda$ denotes electron wavelength, and a denotes convergence angle (half angle) of the primary beam.

$$R = 0.61 \lambda / \alpha = 0.75 / (\alpha \times \sqrt{Vacc}) \qquad [4]$$

When acquiring a plurality of SEM images with different focuses, the focal-point shift amounts among the plurality of images are made equal to or somewhat smaller than the values represented by the expressions [1] to [3]. This makes it possible to obtain the maximum focal-depth enlargement effect in the minimum image number.

Based on the calculations in the expressions [1] to [3], the focal-point shift amount determination unit 51 calculates optimum focal-point shift amounts from the image forming conditions such as the acceleration voltage, electron-source luminance, probe current, pixel number, magnification, and beam resolution. The focal-point shift amount determination unit 51 is also capable of describing these calculation results onto a table in advance, and determining the focal-point shift amount corresponding to an image forming condition by making reference to the table.

Based on the set values of the focal-point shift amounts, the SEM-image continuous acquisition unit 52 varies the focus on one-image grabbing basis. Moreover, the SEM-image continuous acquisition unit 52 continuously performs the focus control and the image grabbing, then storing a series of SEM images with different focuses. The focus control at this time is capable of assuming the following various types of control modes: Namely, the focus is controlled with the present focusing condition selected as the center, the focus is controlled with the present focusing condition selected as the end point, or the focus is controlled within a focusing range set in advance.

(3) S13

In this processing, with respect to the series of respective SEM images with the different focusing conditions acquired in the processing at S12, the image sharpness degrees of partial domains including the length-measuring domain specified are evaluated, thereby determining a SEM image whose image sharpness degree is the highest. This processing is performed by the image-sharpness-degree evaluation unit 54. In the present embodiment, the image sharpness degrees are evaluated by the maximum contrast gradient of the specified length-measuring domain. The contrast gradient indicates variation ratio of brightness between adjacent pixels with respect to brightness distribution of an image. Namely, as an image becomes shaper, the image exhibits larger contrast gradient (i.e., larger variation ratio of brightness). This is because the shaper image accompanies steeper brightness variation at the edge portion.

The image sharpness degrees, however, can also be evaluated by various types of methods other than the maximum contrast gradient. For example, there exists a method of evaluating the image sharpness degrees by applying a spatial filter referred to as "differential filter" to the partial domains to be evaluated, and evaluating the image sharpness degrees based on statistical amounts of the pixel values of the partial domains. In this case, although, as the differential filter, filters such as the Sobel filter as primary differential filter and the Laplacian filter as secondary differential filter have been known, these spatial filters or their modified techniques are also usable. As the statistical amounts, values are used such as total values, average values, variance values, and standard deviation values of the pixel values of the entire partial domains. Then, an image for which the corresponding value becomes the maximum is assumed as the image having the maximum image sharpness degree.

Also, in the present invention, it is also possible to specify image-sharpness-degree evaluating methods which are suitable for the structures of dimension-measuring domains on each domain basis within one and the same field-of-view. The use of the input device 42 permits execution of the specifications of the dimension-measuring domains, the image-sharpness-degree evaluating methods, and the evaluating parameters. Next, referring to FIG. 5, the explanation will be given below concerning the case of using independent image-sharpness-degree evaluating methods for each of a plurality of dimension-measuring domains within one and the same field-of-view.

Figure 5:
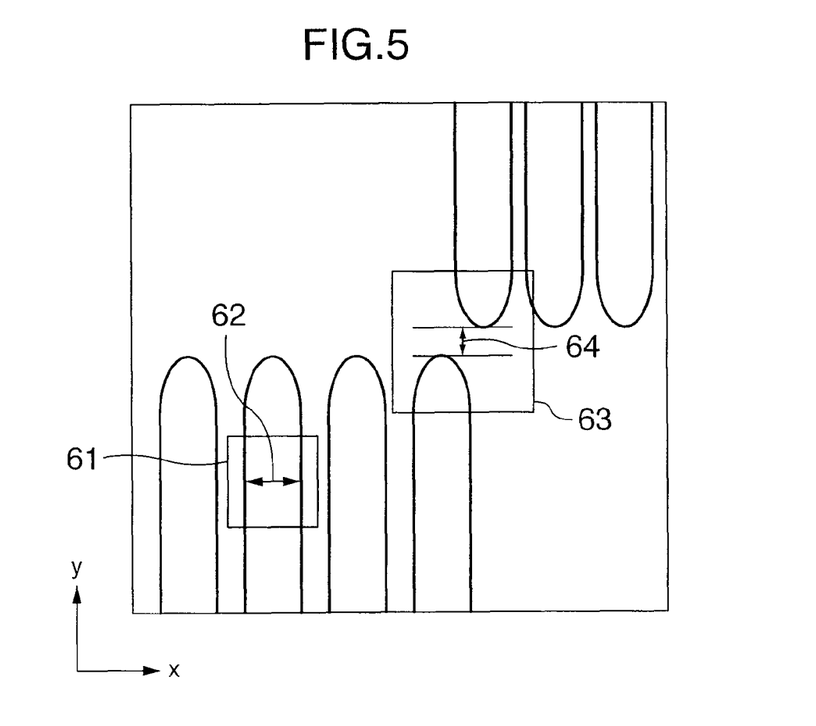
FIG. 5 is an explanatory diagram in the case of using independent image-sharpness-degree evaluating methods for each of a plurality of dimension-measuring domains within one and the same field-of-view.

FIG. 5 illustrates the case of measuring line width 62 of a pattern and a pattern spacing 64 within one and the same field-of-view. In this case, two image-sharpness-degree evaluating partial domains 61 and 63 are set. Within the partial domain 61, edges of the image pattern exist only in the X direction. Accordingly, it is possible to calculate the evaluation value by using the differential filter in the X direction. In contrast thereto, within the partial domain 63, edges of the image patterns exist in all the directions. Consequently, it is impossible to perform the correct image-sharpness-degree evaluation only with the evaluation value calculated by the differential filter in the X direction or the one in the Y direction. In this case, for example, a method is employed which defines, as the image-sharpness-degree evaluation value, the addition value or intensity value (i.e., root of square sum) of the evaluation value by the differential filter in the X direction and the one by the differential filter in the Y direction. In this way, in the case of setting a plurality of dimension-measuring domains within one and the same field-of-view, there are some cases where, depending on the situation of an image pattern within each of the domains, it is advisable to set mage-sharpness-degree evaluating methods independently.

Figure 6A:
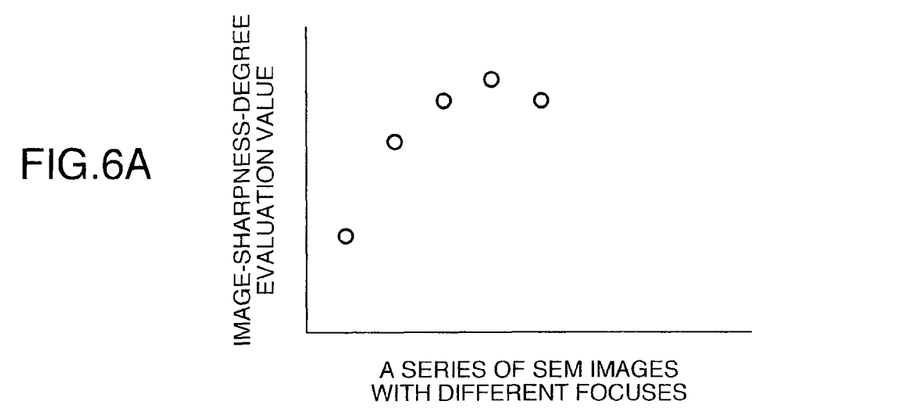
FIGS. 6A, 6B are diagrams for illustrating evaluation examples of the image sharpness degrees for the plurality of SEM images.
Figure 6B:
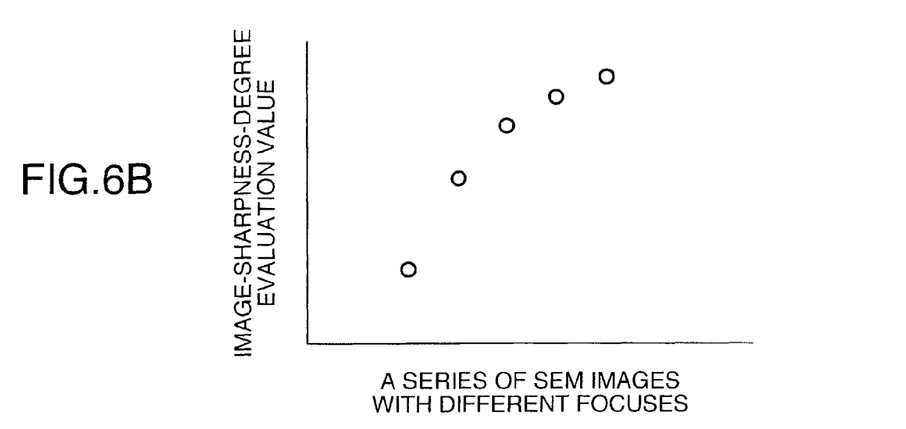

Furthermore, it is also possible to add a function of judging whether or not the maximum value of the image sharpness degrees evaluated with respect to the series of the plurality of SEM images has turned out to become a relative maximum value. This function allows implementation of the detection if the optimum focusing condition for the dimension-measuring domain were not to be included in the SEM images. For example, if, as illustrated in FIG. 6A, the image sharpness degrees assume an extremum with respect to a series of SEM images with different focuses, this situation indicates that a SEM image whose image sharpness degree is the maximum has been under the appropriate focusing condition without fail. However, if, as illustrated in FIG. 6B, the image sharpness degrees assume no extremum with respect to the series of SEM images with the different focuses, this situation indicates a possibility that the focusing condition is inappropriate. In such a case, the processing can be returned to the processing at S12 by displaying the message or changing the initial value. This makes it possible to enhance the reliability of the measurement result.

Incidentally, in the above-described explanation, the explanation has been given concerning the embodiment of selecting the image whose image sharpness degree has been found to be the maximum value. The present invention, however, is not limited thereto. For example, it is also preferable to store a predetermined threshold value in advance, and to select an image having the image sharpness degree which has exceeded this threshold value. Also, if an image is to be selected under a certain limited condition, it is also preferable to select an image which allows the maximum image sharpness degree to be acquired under this condition.

(4) S14

In this processing, with respect to the SEM image determined in the processing at S13, the dimension measurement of the predetermined domain is performed by using the already-known method. The dimension measurement is performed by the length-measurement unit 55.

(5) S15

If a plurality of measurement locations exist within one and the same field-of-view, the dimension measurement is performed by repeating the processing at S13 and the processing at S14. This method allows the length measurement to be executed under a focusing condition appropriate for each length-measuring domain even if height differences exist among the plurality of measurement locations. Also, this method reuses the plurality of SEM images which have been grabbed once. This characteristic makes unnecessary the execution of newly beam irradiation for the measurement, thereby making it possible to perform the high-reliability dimension measurement with the minimum beam irradiation amount.

Figure 7:
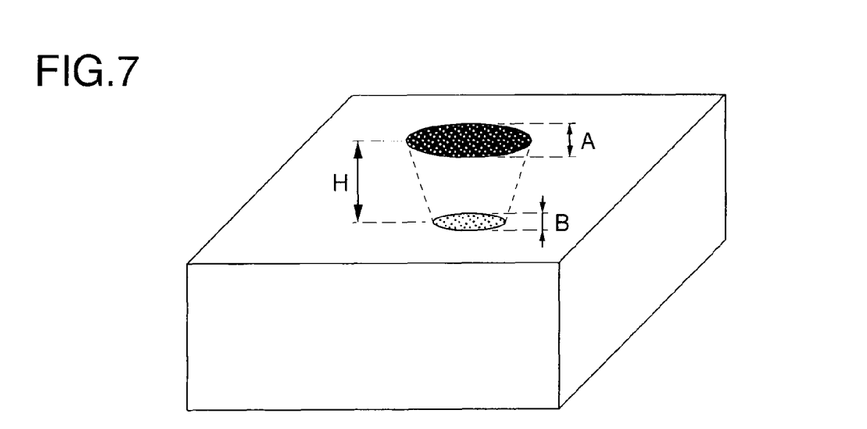
FIG. 7 is an explanatory diagram for illustrating the focus variation range for measuring a sample equipped with different heights (i.e., upper portion and bottom portion of the hole)

Next, referring to FIG. 7, the explanation will be given below concerning an embodiment of the dimension measurement for a sample where the measurement locations are different in height. FIG. 7 illustrates an example of measuring hole upper-portion and hole bottom-portion of a semiconductor having a hole which is deeper than the focal depth of the SEM. Usually, depth (H) of the hole has been already known from structure of the device. Accordingly, in this case, N pieces of SEM images for which the focus is varied by the amount corresponding to value of the focal depth are acquired in each of a domain A and a domain B between which the focus positions relatively differ by H. Moreover, when measuring dimension of the upper surface of the hole, the measurement is performed by selecting an image having the highest sharpness degree from the SEM images of the domain A. Also, when measuring dimension of the hole bottom, the measurement is performed by selecting an image having the highest sharpness degree from the SEM images of the domain B. This allows the domain A and the domain B to be automatically determined with the once detected focusing points used as criterions. This, further, makes it possible to enlarge the focus domains in the image number N which meets accuracy expectation values of the focus points, thereby allowing the high-reliability dimension measurement to be executed.

FIGS. 8A, 8B, 8C, 8D are explanatory diagrams for illustrating an example of measuring bottom diameter and top diameter of a pattern which is higher than the focal depth of the electron beam. In this case, the condition for allowing the focus to be achieved differs depending on a domain to be measured. Consequently, an image for which the specified measurement domain becomes the sharpest is selected from a plurality of SEM images with different focuses. This makes it possible to automatically measure the correct dimension.

Figure 8A:
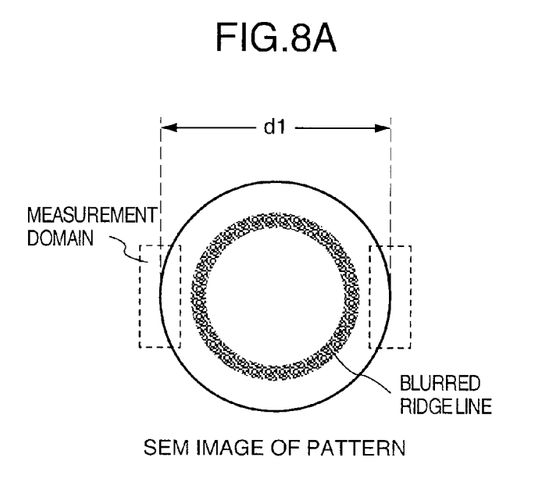
FIGS. 8A, 8B, 8C, 8D are explanatory diagrams for illustrating measurement examples of the bottom diameter and top diameter of a pattern.
Figure 8B:
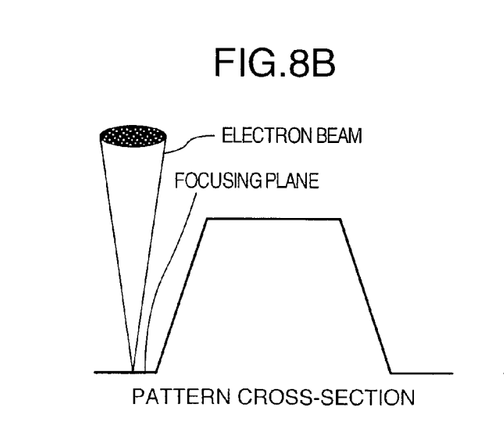
Figure 8C:
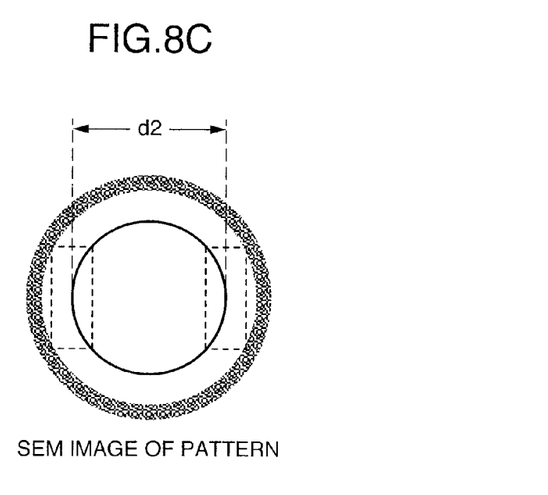
Figure 8D:
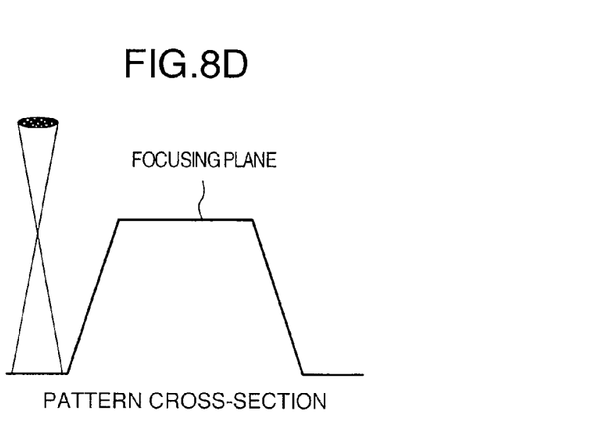

Namely, when measuring the bottom diameter of the pattern, as illustrated in FIG. 8A, from a plurality of SEM images acquired by varying the focus position, an image which is best-focused to the bottom domain, i.e., the image for which contrast gradient of the dimension-measuring domain at the bottom becomes the maximum value, is extracted, then measuring the bottom diameter d1. As illustrated in a cross-sectional schematic diagram in FIG. 8B, this image is an image in a state where focusing plane of the electron beam coincides with the bottom domain of the pattern. Accordingly, ridge line of the pattern top is blurred, although the image of the bottom domain is sharp. Also, when measuring the top diameter of the pattern, as illustrated in FIG. 8C, from the plurality of SEM images acquired by varying the focus position, an image which is best-focused to the top domain, i.e., the image for which contrast gradient of the dimension-measuring domain on the top becomes the maximum value, is extracted, then measuring the top diameter d2. As illustrated in a cross-sectional schematic diagram in FIG. 8D, this image is an image in a state where the focusing plane of the electron beam coincides with the top domain of the pattern. Accordingly, the image of the bottom domain is blurred, although the image of the pattern top is sharp.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A dimension measuring method for measuring dimension of patterns formed on a specimen in accordance with electrons obtained by scanning of electron beam for the specimen, comprising the steps of:
    obtaining plurality of images by using electron beam of different focus condition;
    evaluating focus condition selectively of at least two partial domains as to the obtained plurality of images; and
    measuring dimension between edges of a pattern included in a partial domain using images of which focus of the partial domain is focalized.

2. A dimension measuring method according to claim 1, wherein as to at least two partial domains, focus evaluation is carried out in accordance with a different focus evaluation method.

3. A dimension measuring method according to claim 1, wherein as to at least two partial domains, sharpness degree evaluation is carried out in a different direction.

4. A dimension measuring method according to claim 1, wherein as to at least two partial domains, sharpness degree evaluation is carried out in accordance with direction of edge included in the partial domain.

5. A dimension measuring method according to claim 1, wherein as to at least two partial domains, sharpness degree evaluation is carried out in accordance with differential filter of a different direction.

6. A dimension measuring method according to claim 1, wherein as to the plurality of partial domains, measurement of dimension between edges is carried out using images of a different focus condition.

7. A pattern dimension measurement apparatus including a processing unit for measuring dimension of a pattern formed on a specimen in accordance with a detection signal detected by a scanning electron microscope, wherein:
    the processing unit obtains a plurality of images using electron beam of different focus condition, selectively evaluates focus condition of at least two partial domains as to the obtained plural images, and measures dimension between edges of a pattern included in a partial domain using an image of which focus of the partial domain is focalized.

8. A dimension measuring method according to claim 7, wherein as to at least two partial domains, focus evaluation is carried out in accordance with a different focus evaluation method.

9. A dimension measuring method according to claim 7, wherein as to at least two partial domains, sharpness degree evaluation is carried out in a different direction.

10. A dimension measuring method according to claim 7, wherein as to at least two partial domains, sharpness degree evaluation is carried out in accordance with direction of edge included in the partial domain.

11. A dimension measuring method according to claim 7, wherein as to at least two partial domains, sharpness degree evaluation is carried out in accordance with differential filter of different direction.

12. A dimension measuring method according to claim 7, wherein as to the plurality of partial domains, measurement of dimension between edge is carried out using images of a different focus condition.

* * * * *